(12) United States Patent
Kayanuma et al.

(10) Patent No.: US 7,019,374 B2
(45) Date of Patent: Mar. 28, 2006

(54) SMALL-SIZED IMAGE PICK UP MODULE (75) Inventors: Yasuaki Kayanuma, Yamanashi (JP); Akihito Watanabe, Yamanashi (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 0 days.

(21) Appl. No.: 10/916,544

(22) Filed: Aug. 12, 2004

(65) Prior Publication Data
US 2005/0035421 A1 Feb. 17, 2005

(30) Foreign Application Priority Data
Aug. 13, 2003 (JP) .............................. 2003-207529

(51) Int. Cl.
*H01L 31/0232* (2006.01)

(52) U.S. Cl. .................... 257/432; 257/59; 257/98; 257/99; 257/294; 257/433; 257/435

(58) Field of Classification Search ............... 257/59, 257/98, 432, 294, 433, 435, 99
See application file for complete search history.

(56) References Cited

U.S. PATENT DOCUMENTS
6,476,417 B1 * 11/2002 Honda et al. .............. 257/59

FOREIGN PATENT DOCUMENTS
JP  2001-245217  9/2001
JP  2001-333332  11/2001

* cited by examiner

*Primary Examiner*—Minhloan Tran
*Assistant Examiner*—Tan Tran
(74) *Attorney, Agent, or Firm*—Browdy and Neimark, PLLC (57) ABSTRACT

A compact imaging module comprising a case having a lens holding barrel portion, an optical system member housed in the lens holding barrel portion, a circuit substrate having a wiring pattern and disposed in an image side of the optical system member, a plurality of electrodes disposed on the circuit substrate, an imaging sensor mounted on a surface of the circuit substrate, an opposite side of the contained optical system member, and a frame member provided on a periphery of the circuit substrate, the case including a substrate mounting surface having a sensor window, the circuit substrate being attached to the substrate mounting surface of the case, the frame member including conductive electrodes to guide out a signal of the imaging sensor mounted on the circuit substrate.

10 Claims, 9 Drawing Sheets

SMALL-SIZED IMAGE PICK UP MODULE

CROSS REFERENCE TO THE RELATED APPLICATION

The application claims the priority benefit of Japanese Patent Application No. 2003-207529, filed on Aug. 13, 2003, the entire descriptions of which are incorporated herein by reference.

BACKGROUND OF THE INVENTION

1. Field of the Invention

The present invention relates to an improvement in a compact imaging module provided with an imaging sensor such as a CMOS (complementary metal-oxide semiconductor) sensor, CCD (charge-coupled device) sensor or the like, more specifically to an inexpensive compact imaging module that a high density mounting is possible by combining a case of resin formation and an existing circuit substrate.

2. Description of Related Art

Recently, there has been sold a phone such as a mobile phone, PHS or the like containing a digital camera function capable of taking a photograph, and users of the phone can send the photograph as an attached file of an e-mail. A great number of the mobile phones having the camera function each comprising a compact imaging module in which a solid-state imaging sensor such as a CMOS sensor, CCD sensor or the like and an optical member such as a lens, aperture stop or the like are installed and united in a case, similarly as a digital camera.

A conventional compact imaging module using the above-mentioned CMOS sensor is disclosed in Japanese Patent Laid-Open 2001-245217, hereinafter a basic structure thereof will be described.

Figure 6:
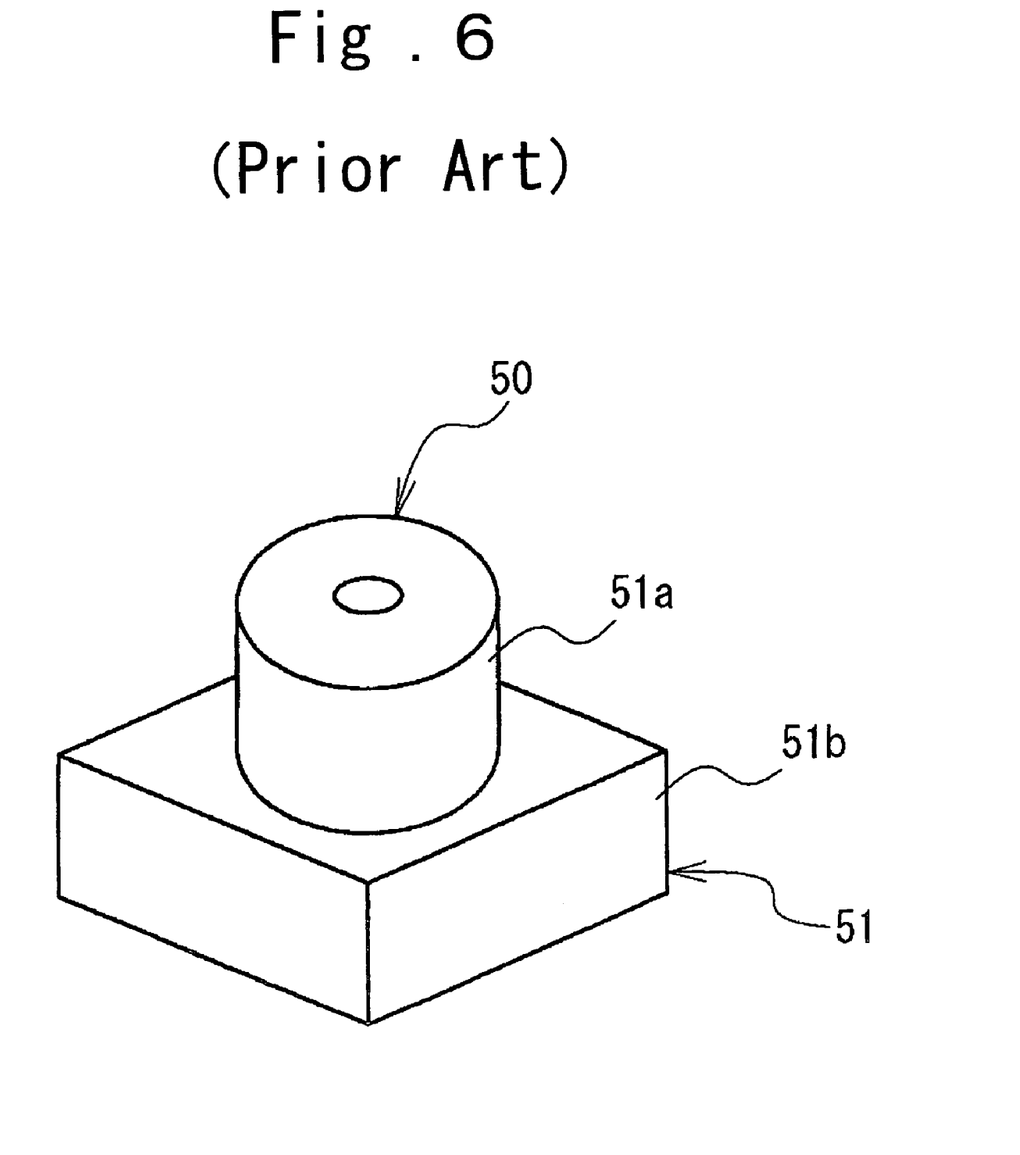
FIG. 6 is an exterior perspective view showing a structure of a conventional compact imaging module.
Figure 7:
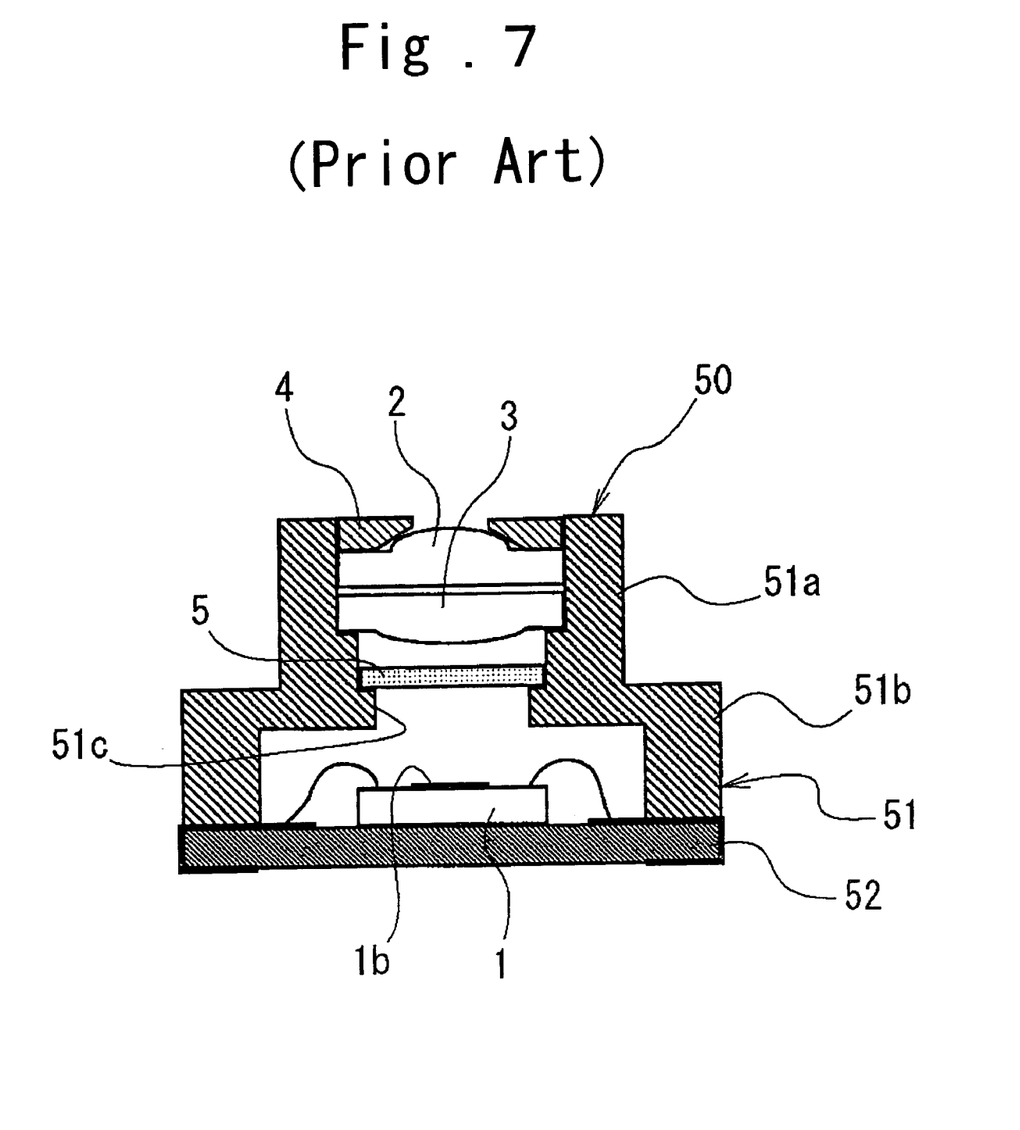
FIG. 7 is a sectional view of the compact imaging module shown in FIG. 6.

FIGS. 6 and 7 illustrate a structure of the conventional compact imaging module 50 using the CMOS sensor 1. In FIGS. 6 and 7, 51 is a case which is formed by a resin and which is provided with a lens holding barrel portion 51a, a sensor containing portion 51b disposed on an lower surface of the lens holding barrel portion 51a, and a sensor window 51c between the lens holding barrel portion 51a and the sensor containing portion 51b. Disposed within the lens holding barrel portion 51a is an optical system member which includes an aperture stop member 4, lenses 2 and 3, and an IR cutting filter 5 disposed in turn from an imaging side of the optical system member.

52 is a circuit substrate, on which the CMOS sensor 1 as the imaging sensor is mounted by wire-bonding, a light receiving portion 1b of the CMOS sensor 1 is disposed to oppose to the sensor window 51c of the case 51. The compact imaging module 50 is structured by containing the circuit substrate 52 mounting the CMOS sensor 1 in the sensor containing portion 51b.

However, the compact imaging module 50 having the structure as described above tends to be a large size and is not able to satisfy request for miniaturization.

Therefore, in order to satisfy further demand of miniaturization, a compact imaging module has been developed as disclosed in Japanese Patent Laid-Open 2001-333332, a basic structure thereof will be described referring to FIGS. 8 and 9, hereinafter.

Figure 8:
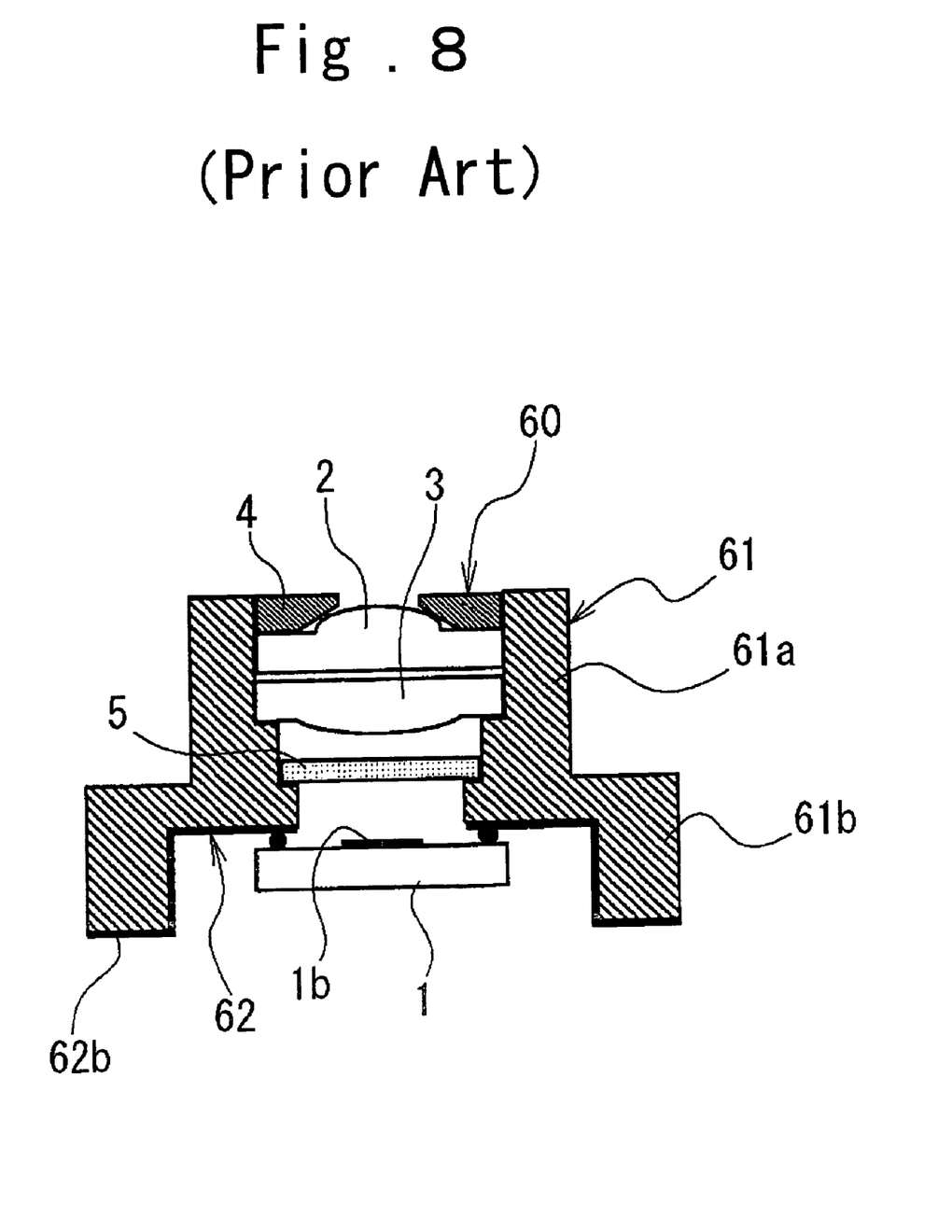
FIG. 8 is a sectional view of a compact imaging module in a second conventional example.
Figure 9:
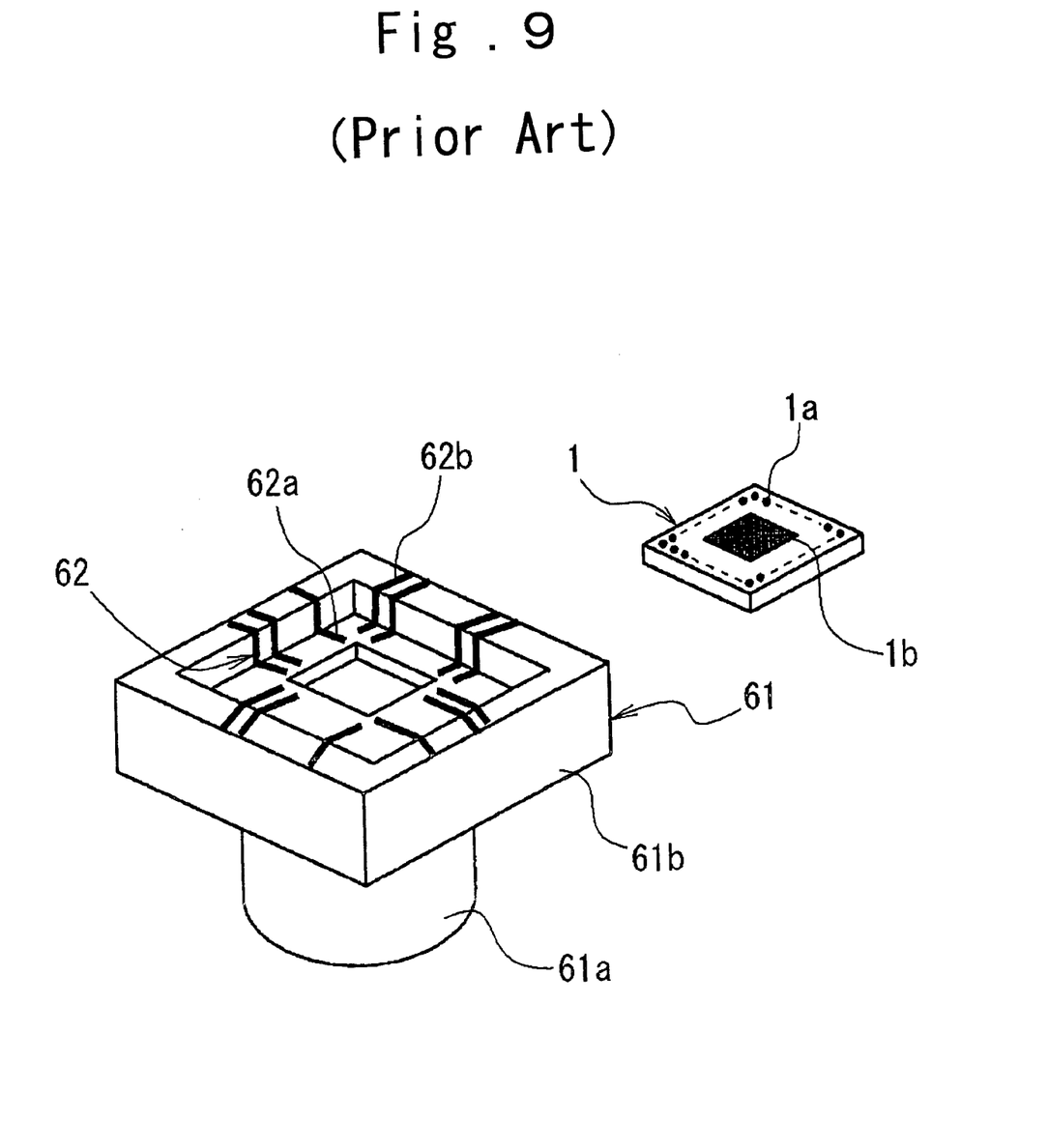
FIG. 9 is an exploded perspective view showing an assembling state of the compact imaging module shown in FIG. 8.

In FIGS. 8 and 9, the same numerals are attached to the similar parts as in FIG. 7, and the overlapped description is omitted.

As shown in FIG. 9, a wiring pattern 62 is formed on an inner surface of a sensor containing portion 61b of a case 61. Mounting terminal portions 62a for mounting the CMOS sensor 1 and outside connecting terminal portions 62b drawn-out to a lower surface of the sensor containing portion 61b are integrally formed on the wiring pattern 62.

The CMOS sensor 1 is mounted on the case 61 by face down-bonding bumps 1a provided on the CMOS sensor 1 on the mounting terminal portions 62a. In FIG. 9, the CMOS sensor 1 is reversed and bonded on the case 61.

FIG. 8 shows a state of mounting the CMOS sensor 1 on the case 61, the lenses 2, 3, the aperture stop member 4 and the IR cutting filter 5 are contained in a lens holding barrel portion 61a of the case 61, similarly as in FIG. 7.

The CMOS sensor 1 is face down-bonded on the mounting terminal portions 62a of the wiring pattern 62 formed on the inner surface of the sensor containing portion 61b so that a compact imaging module 60 is structured.

In the state, the light receiving portion 1b of the CMOS sensor 1 is disposed to oppose to the sensor window 61c of the case 61, and configured to receive a signal light passing through the optical system member of the lens and so on. The signal light processed by the CMOS sensor 1 is outputted from the outside connecting terminal portions 62b through the wiring pattern 62 to the outside.

The structure shown in FIGS. 8 and 9 is referred to as a MID in which a three-dimensional conductive circuit is formed on a resin forming body constituting the case 61 without using the circuit substrate 52 shown in FIG. 7, the mounting of the CMOS sensor 1 and the formation of the outside connecting terminal portions are carried out simultaneously by the three-dimensional conductive circuit.

As a method for forming the three-dimensional conductive circuit on the resin forming body, there are a one-time forming method for forming a conductive pattern on a surface of the resin forming body by means of a transfer, and a two-time forming method for forming primarily a pattern forming portion by a plating grade resin, forming secondarily a pattern non-forming portion by a non-plating grade resin, and forming partially a plated pattern by use of a difference of the plating grades.

The compact imaging module structured by the aforementioned MID has a merit that further miniaturization can be achieved in comparison with the compact imaging module using the circuit substrate shown in FIG. 7, at the same time, there are problems as follows.

That is to say, it is difficult to form a fine pattern as in a pattern etching art used for pattern formation of a conventional circuit substrate, for the method for forming the three-dimensional conductive circuit on the resin forming body. Consequently, if a CMOS sensor having many pixels and high resolution is used as the imaging sensor, a pitch between narrow pads is requested, because a great number of terminals are required, the MID art cannot correspond to the circumstances.

Furthermore, in the compact imaging module of the MID structure, the cost of manufacture is higher because many manufacturing processes are required.

SUMMARY OF THE INVENTION

The present invention has been made in view of the problems of the prior art mentioned above, an object thereof is to provide a compact imaging module capable of achieving miniaturization similar to a MID system, installation of a CMOS having a great number of pixels, and cost down as a completed product.

To accomplish the above-mentioned object, a compact imaging module in an aspect of the present invention comprises a case, an optical system member attached to the case, a circuit substrate having a wiring pattern and disposed adjacent to the optical system member in an image side of the optical system member and attached to the case, electrodes disposed on the circuit substrate and an imaging sensor mounted on the circuit substrate and electrically connected to the electrodes.

A compact imaging module in another aspect of the present invention comprises a case having a lens holding barrel portion, an optical system member housed in the lens holding barrel portion, a circuit substrate having a wiring pattern and disposed land electrodes disposed in an image side of the optical side and, an imaging sensor mounted on a surface of the circuit substrate opposite to the optical system member, and a frame member provided on a periphery of the circuit substrate.

The case is provided in the imaging side of the optical system member and includes a substrate-mounting surface having a sensor window.

The circuit substrate is attached to the substrate-mounting surface of the case by an adhesive sheet.

The frame member includes conductive electrodes to guide out a signal of the imaging sensor mounted on the circuit substrate.

DETAILED DESCRIPTION OF THE PREFERRED EMBODIMENTS

Preferred embodiments of the present invention will be explained in detail with reference to the accompanying drawings below.

Figure 1:
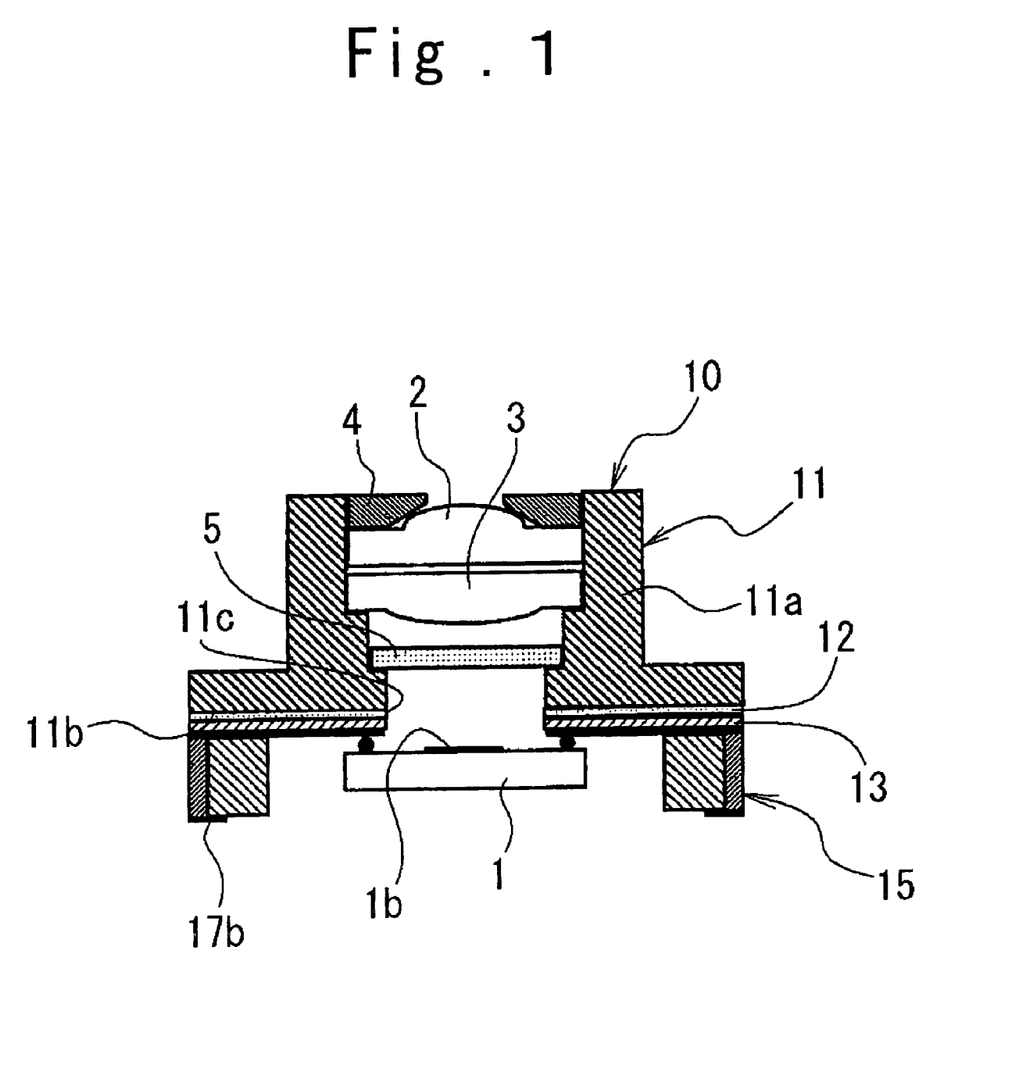
FIG. 1 is a sectional view of a compact imaging module in a first embodiment of the present invention.
Figure 2:
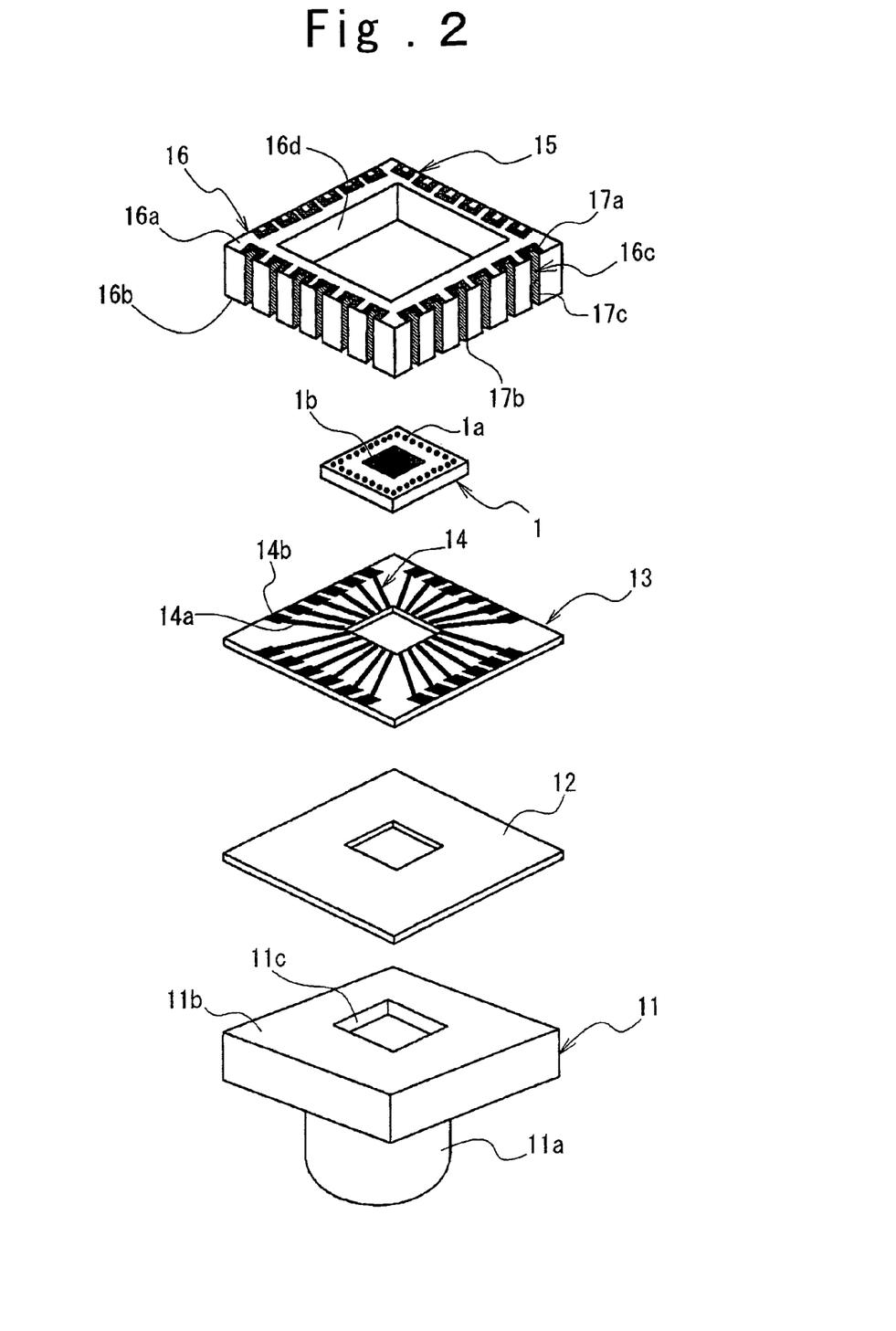
FIG. 2 is an exploded perspective view showing an assembling state of the compact imaging module shown in FIG. 1.

FIGS. 1 and 2 illustrate a first embodiment of a compact imaging module according to the present invention. In FIGS. 1 and 2, the same numerals are attached to the similar parts as in FIG. 7, and the overlapped description is omitted.

In FIGS. 1 and 2, 10 is a compact imaging module, and 11 case. As shown in FIG. 2, the case 11 includes a lens holding barrel portion 11a for containing the aforementioned optical system member and a bottom surface portion 11b having a sensor window 11c provided on a side of a lower surface of the lens holding barrel portion 11a, in other words, on an image side of the optical system member, and the lens holding barrel portion 11a and the bottom surface portion 11b are integrally formed by a resin to form the case 11. 12 is an adhesive sheet, 13 a flexible printed circuit (hereinafter referred to as FPC), which corresponds to the circuit substrate. The circuit substrate 13 is formed with a fine pattern 14 by a conventional pattern etching technology.

15 is a frame member which includes a resin frame 16 having the same outer diameter as that of the FPC 13. Land electrodes 17a and 17b are provided on upper and lower surfaces 16a and 16b of the resin frame 16. The frame member 15 has conductive electrodes 17c provided in through-holes 16c formed between the land electrodes 17a and 17b.

Meanwhile, the frame member 15 can be made easily by a forming method of through-hole electrodes or side electrodes in a conventional double-surface circuit substrate. That is to say, after the land electrodes 17a and 17b are formed on a double-surface circuit substrate of glass epoxy resin, in which a copper is attached on the both surfaces, by a pattern etching, the through-holes 16c are formed between the land electrodes 17a and 17b, and the conductive electrodes 17c are formed by plating within the through-holes 16c. Thereafter, an inner peripheral hole 16d is processed in the circuit substrate of the glass epoxy resin or the like, further a center (in case of through-side) or an outer side (in case of through-hole) of each through-hole 16c is processed so as to form an outer periphery of the resin frame 16, whereby completing the frame member 15.

Next, an assembling method of the compact imaging module 10 will be described.

In FIG. 2, the FPC 13 is first adhered to the bottom surface portion 11b of the case 11 through the adhesive sheet 12. The CMOS sensor 1 is then mounted on a surface of the FPC 13 adhered to the case 11, opposite to the optical system member. Consequently, the FPC 13 is disposed adjacent to the optical system member and disposed between the optical system member and the CMOS sensor 1. As a mounting procedure, with reversing the CMOS sensor 1 which is in a state in FIG. 2, bumps 1a of the CMOS sensor 1 are mounted on mounting electrodes 14a provided inside the FPC 13 by face down-bonding.

Finally, the frame member 15 is attached to the FPC 13 so that a sensor mounting part of the compact imaging module 10 is completed.

A mounting method of the frame member 15 is carried out as follows.

Connecting electrodes 14b formed peripherally of the FPC 13 and the land electrodes 17a of the frame member 15 are directly and conductively connected by means of a conductive adhesive or soldering re-flow, or the connecting electrodes 14b and the land electrodes 17a are electrically and mechanically secured by contacting closely the connecting and land electrodes 14b and 17a, fixing a periphery thereof with an adhesive referred to as a NCP (non-conductive paste), as a result of conductive connection due to thermal contraction of the NCP.

Subsequently, the compact imaging module 10 is completed by containing the optical system member of the lenses 2 and 3, the aperture stop 4, the IR cutting filter 5 and so on, in the lens holding barrel portion 11a of the case 11, as shown in FIG. 1.

An operation of the compact imaging module 10 will be described.

A signal light from the outside and passed through the optical system member enters the light receiving portion 1b of the CMOS sensor 1 through the sensor window 11c of the case 11 and is converted into an electrical signal by the CMOS sensor 1. The electrical signal is transmitted through the mounting and connecting electrodes 14a and 14b of the FPC 13 to the frame member 15, and taken out from the land electrodes 17b through the land and conductive electrodes 17a and 17c of the frame member 15 to the outside.

That is to say, the land electrodes 17b correspond to outside connecting electrodes.

There are advantageous effects that the compact imaging module 10 having the above-mentioned structure can be miniaturized in the same shape as the compact imaging module having the MID structure, and a wiring density on the wiring pattern thereof can be achieved by a conventional circuit substrate technology. Moreover, because the FPC 13 and the frame member 15 can be manufactured by a conventional circuit substrate technology, there is an advantageous effect that cost down for producing a compact imaging module can be achieved.

Figure 3:
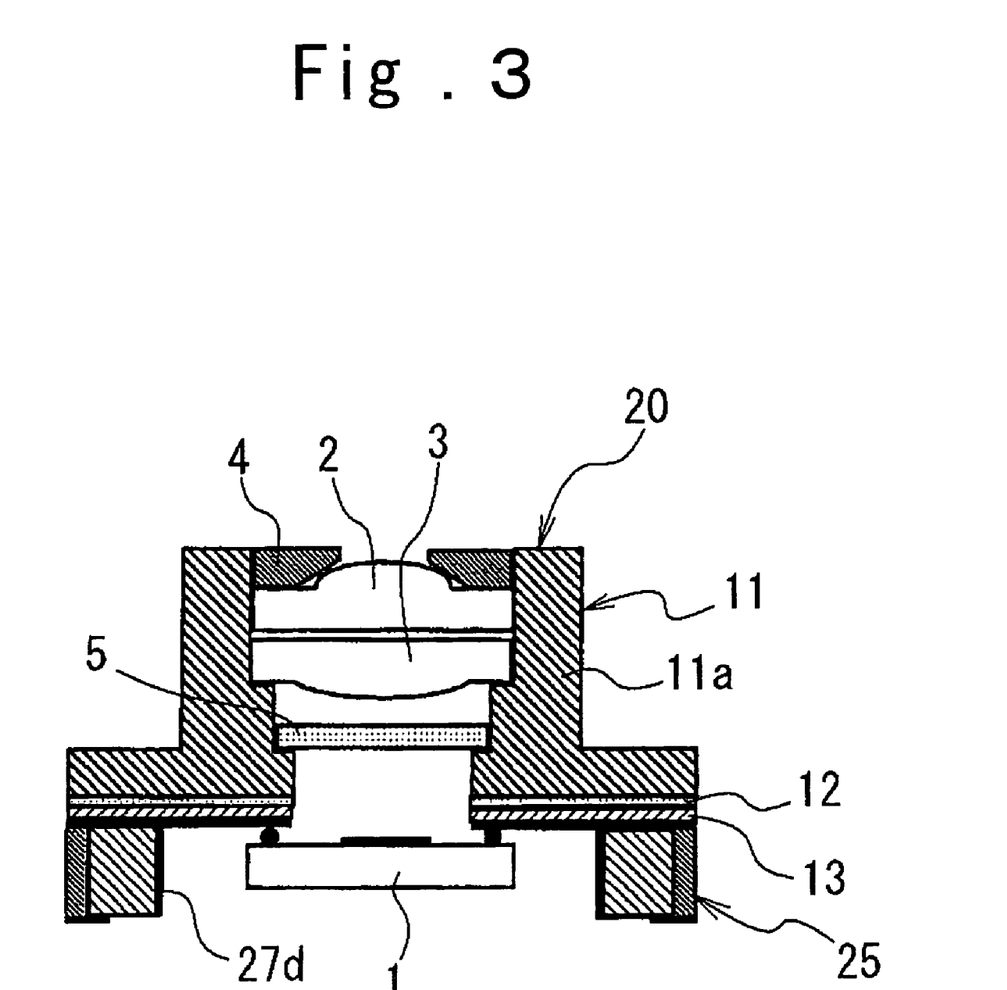
FIG. 3 is a sectional view of a compact imaging module in a second embodiment of the present invention.
Figure 4:
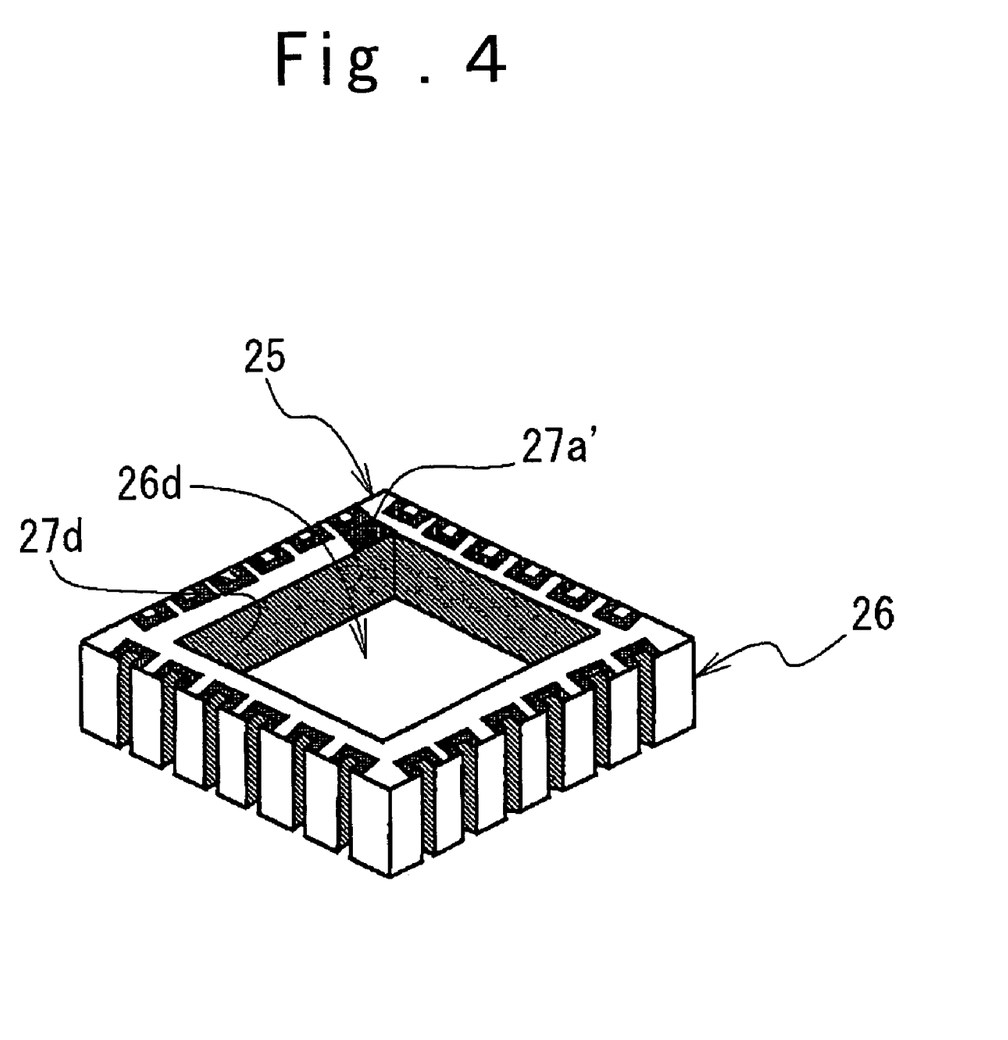
FIG. 4 is a perspective view of a frame member in the compact imaging module shown in FIG. 3.

FIGS. 3 and 4 illustrate a compact imaging module 20 in a second embodiment of the present invention.

In FIGS. 3 and 4, the same numerals are attached to the similar parts as in FIG. 1, and the overlapped description is omitted.

A frame member 25 shown in FIG. 4 differs from the frame member 15 shown in FIG. 2 in that a metallic film 27d as a shielding film is formed on the entire surface of an inner peripheral hole 26d of a resin frame 26, and the metallic film 27d is connected with a land electrode 27a' which is connected with a power terminal of the CMOS sensor 1.

The compact imaging module 20 of the above-mentioned structure has advantageous effects as follows.

As shown in FIG. 3, the CMOS sensor 1 can be protected from exterior noise electric field by a shielding effect of the metallic film 27d formed on the inner peripheral hole 26d of the frame member 25 surrounding the CMOS sensor 1 and also, from noise light passing through the resin frame 26 of glass epoxy or the like.

Figure 5:
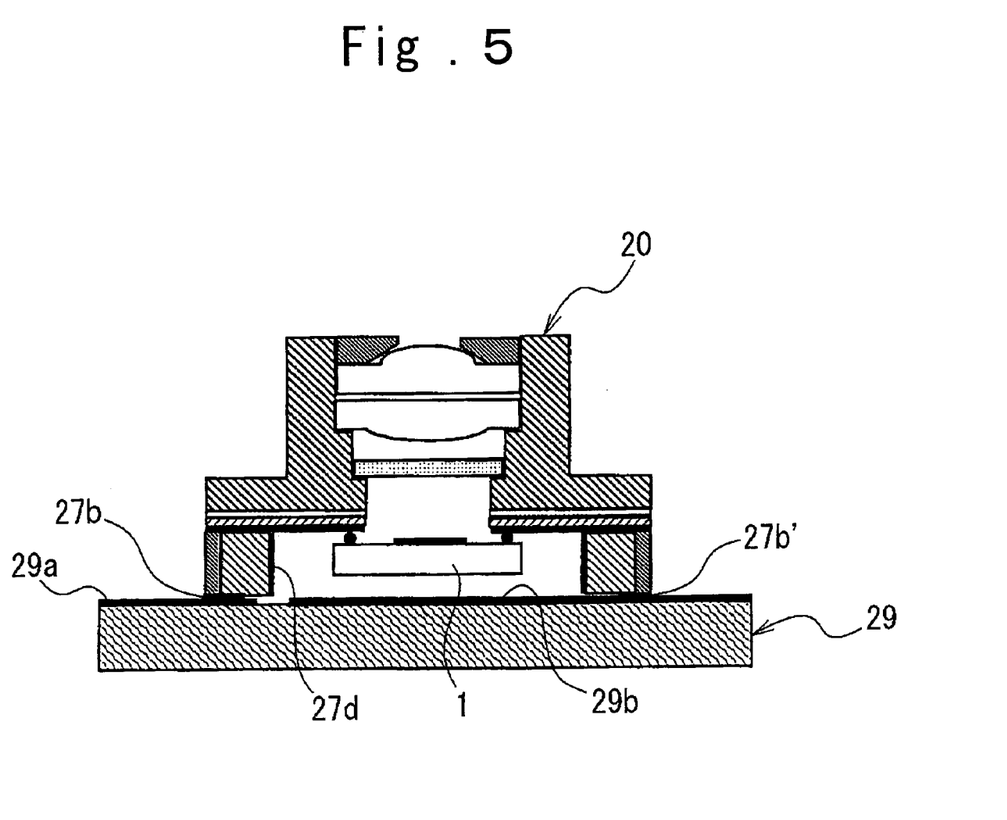
FIG. 5 is a sectional view showing a state in which the compact imaging module shown in FIG. 3 is mounted on a mother board.

FIG. 5 shows a state of mounting the compact imaging module 20 on a mother board 29. The mother board 29 is provide with a connecting electrode 29a disposed at a position corresponding to an outside connecting terminal 27b or land electrode of the compact imaging module 20 and a metallic film 29b as a shielding electrode disposed in an area covering the inner peripheral hole 26d of the frame member 25, the metallic film 29b is connected with a land electrode 27b' which is connected with the power terminal of the CMOS sensor 1.

Accordingly, by adopting the mounting structure shown in FIG. 5 to the compact imaging module 20, side and bottom surfaces of the CMOS sensor 1 are all protected from the noise light and the noise electronic filed to perform very stable operation.

Although the embodiments illustrate a system that each of the parts of the case 11, the FPC 13, the frame member 15 and so on is structured separately, the compact imaging module may be produced by forming the parts or one portion of the parts by a plurality of assemblies and by cutting the assemblies, after assembling, without being limited to the embodiments.

As described above, because the compact imaging module according to the present invention can be miniaturized in the same shape as the compact imaging module of the MID structure, and the wiring density on the wiring pattern thereof can be achieved by the conventional circuit substrate art, a sufficiently miniaturized compact imaging module can be provided even if the CMOS sensor is used.

Furthermore, the CMOS sensor can be protected from the noise light and the noise electric field by forming the shielding film on the inner peripheral hole of the frame member and connecting it with the power terminal of the CMOS sensor, further, the protecting effect can be even enhanced by mounting the compact imaging module on the mother board having the shielding electrode.

Although the preferred embodiments of the present invention have been described, the present invention is not limited to the embodiments, various changes and modifications can be made to the embodiments.

What is claimed is:

1. A small-sized image pick up module, comprising:
    a case having a lens holding barrel portion;
    an optical system member contained in said lens holding barrel portion;
    a circuit substrate having a wiring pattern disposed in an image side of the optical system member;
    a plurality of electrodes disposed on the circuit substrate;
    an imaging sensor mounted on a surface of the circuit substrate, an opposite side of the contained optical system member to connect the electrodes disposed on the circuit substrate; and
    a frame member provided on a periphery of the circuit substrate,
    said case including a substrate-mounting surface having a sensor window,
    said circuit substrate being attached to the substrate-mounting surface of the case,
    said frame member including conductive electrodes to guide out a signal of the imaging sensor mounted on the circuit substrate through the electrodes disposed on the circuit substrate.

2. The small-size image pick up module according to claim 1, wherein
    the plurality of electrodes comprise land electrodes and connecting electrodes.

3. The small-sized image pick up module according to claim 1, wherein
    said circuit substrate comprises a flexible printed circuit.

4. The small-sized image pick up module according to claim 1, wherein
    said conductive electrodes of the frame member comprise through-hole electrodes or side electrodes, which are formed on an outer peripheral portion of the frame member.

5. The small-sized image pick up module according to claim 1, wherein
    a shielding film is provided on an inner peripheral portion of the frame member to shield the imaging sensor.

6. The small-sized image pick up module according to claim 5, wherein
    said shielding film is a metallic film which is connected with a power terminal of the imaging sensor.

7. The small-sized image pick up module according to claim 1, wherein
    said circuit substrate is adhered through an adhesive sheet to the substrate mounting surface of the case.

8. The small-sized image pick up module according to claim 1, wherein
    said frame member has an outer end surface projecting outwardly from an outer end surface of the imaging sensor, and one end of each conductive electrode is disposed in the outer end surface of the frame member.

9. The small-sized image pick up module according to claim 8, wherein when the small-sized image pick up module is mounted on a mother board, the conductive electrodes disposed on the outer end surface of the frame member are connected to a wiring pattern of the mother board.

10. An optical apparatus comprising the small-sized image pick up module according to claim 1.

* * * * *